US009365416B2

(12) United States Patent
Shu et al.

(10) Patent No.: US 9,365,416 B2
(45) Date of Patent: Jun. 14, 2016

(54) STRUCTURE AND METHOD FOR MOTION SENSOR

(75) Inventors: Chia-Pao Shu, New Taipei (TW); Wen-Chuan Tai, Dayuan Township, Taoyuan County (TW); Chia-Ming Hung, Taipei (TW); Hsiang-Fu Chen, Jhudong Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 339 days.

(21) Appl. No.: 13/433,906

(22) Filed: Mar. 29, 2012

(65) Prior Publication Data
US 2013/0043510 A1 Feb. 21, 2013

Related U.S. Application Data

(60) Provisional application No. 61/523,561, filed on Aug. 15, 2011.

(51) Int. Cl.
*H01L 29/84* (2006.01)
*B81C 1/00* (2006.01)

(52) U.S. Cl.
CPC ....... *B81C 1/00269* (2013.01); *B81C 2203/036* (2013.01)

(58) Field of Classification Search
CPC .................. B81C 1/00269; B81C 1/00246
USPC .................. 257/254, 415–420; 438/50–53
See application file for complete search history.

(56) References Cited

U.S. PATENT DOCUMENTS

| 2005/0170656 | A1 | 8/2005 | Nasiri et al. |
| 2010/0109102 | A1* | 5/2010 | Chen et al. .................... 257/417 |
| 2011/0012247 | A1 | 1/2011 | Wu |
| 2012/0061776 | A1* | 3/2012 | Cheng et al. .................. 257/415 |
| 2012/0074590 | A1* | 3/2012 | Lin et al. ....................... 257/777 |

FOREIGN PATENT DOCUMENTS

| CN | 101034726 A | 9/2007 |
| TW | 201018640 A | 5/2010 |

OTHER PUBLICATIONS

Unpublished U.S. Appl. No. 13/035,607, filed Feb. 25, 2011 entitled Package Systems and Manufacturing Methods Thereof, 28 pages.

* cited by examiner

*Primary Examiner* — Matthew W Such
*Assistant Examiner* — Scott Stowe
(74) *Attorney, Agent, or Firm* — Haynes and Boone, LLP

(57) ABSTRACT

The present disclosure provides one embodiment of a motion sensor structure. The motion sensor structure includes a first substrate having an integrated circuit formed thereon; a second substrate bonded to the first substrate from a first surface, wherein the second substrate includes a motion sensor formed thereon; and a third substrate bonded to a second surface of the second substrate, wherein the third substrate includes a recessed region aligned with the motion sensor.

31 Claims, 7 Drawing Sheets

STRUCTURE AND METHOD FOR MOTION SENSOR

PRIORITY DATA

This patent claims the benefit of U.S. Provisional Patent Application Ser. No. 61/523,561 filed Aug. 15, 2011, the entire disclosure of which is hereby incorporated by reference.

BACKGROUND

In wafer level packaging of a micro-electro mechanical system (MEMS) device, an eutectic bonding method is implemented. However, a compression (e.g., squish) issue during the eutectic bonding causes contamination or even device failure. Therefore, an improved structure and method for wafer level packaging is needed to address the above issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
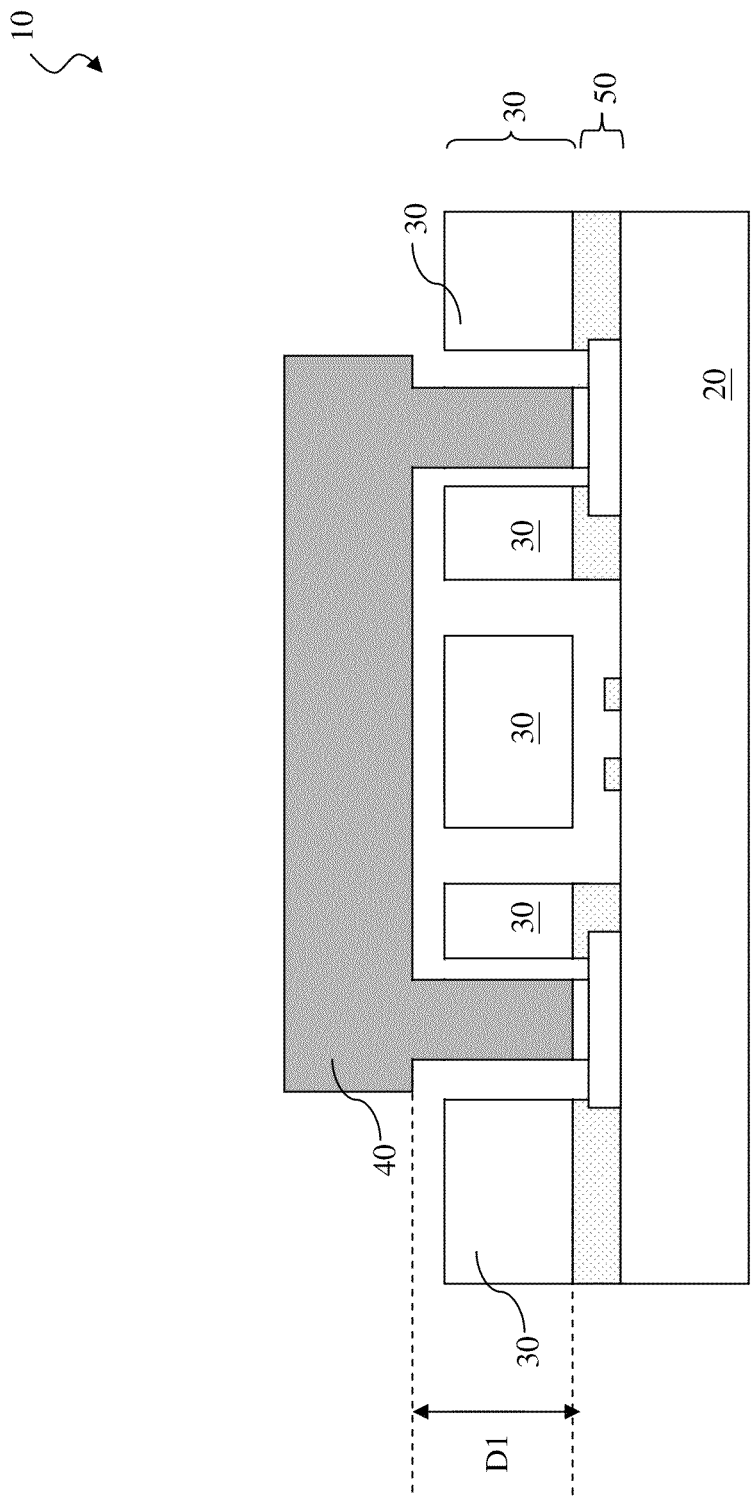
FIG. 1 illustrates one embodiment of a motion sensor structure in a sectional view constructed according to aspects of the present disclosure.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

The present disclosure provides a structure for a motion sensor, such as a micro-electro mechanical system (MEMS) device, and a method making the same constructed according to various embodiments.

FIG. 1 illustrates a one embodiment of motion sensor structure 10 in a sectional view. The motion sensor structure 10 includes a first substrate 20 having an integrated circuit formed thereon and a second substrate 30 having a motion sensor formed thereon. A capping feature 40 is formed on the motion sensor. Both the second substrate 30 and the capping substrate 40 are directly boned to the first substrate 20 through various bonding features 50. Particularly, the capping substrate 40 is directly bonded to the first substrate 20 through a via of the second substrate 30. In one example, the capping substrate 40 is bonded to the top metal of the interconnect structure of the first substrate 20.

In this embodiment, the bonding ratio between the first substrate 20 and the second substrate 30 is low since the bonding area is reduced by the through via. This leads to poor bonding issues. The bonding ratio may be further reduced for advanced technologies associated with the reduced die sizes since the unmoved bonding region is less. The bonding ratio between the first substrate 20 and the capping substrate 40 is low as well due to the limited bonding area. In other side, leak current may be induced due to the inter-metal dielectric (IMD) cracking. The capping substrate 40 has a relatively great thickness to be able to reach the first substrate 20 through the via of the second substrate 30. The cap depth D1 is also relatively higher. Accordingly, the etching depth is not easy to control due to etching process uniformity and etching throughput is reduced accordingly.

Figure 2:
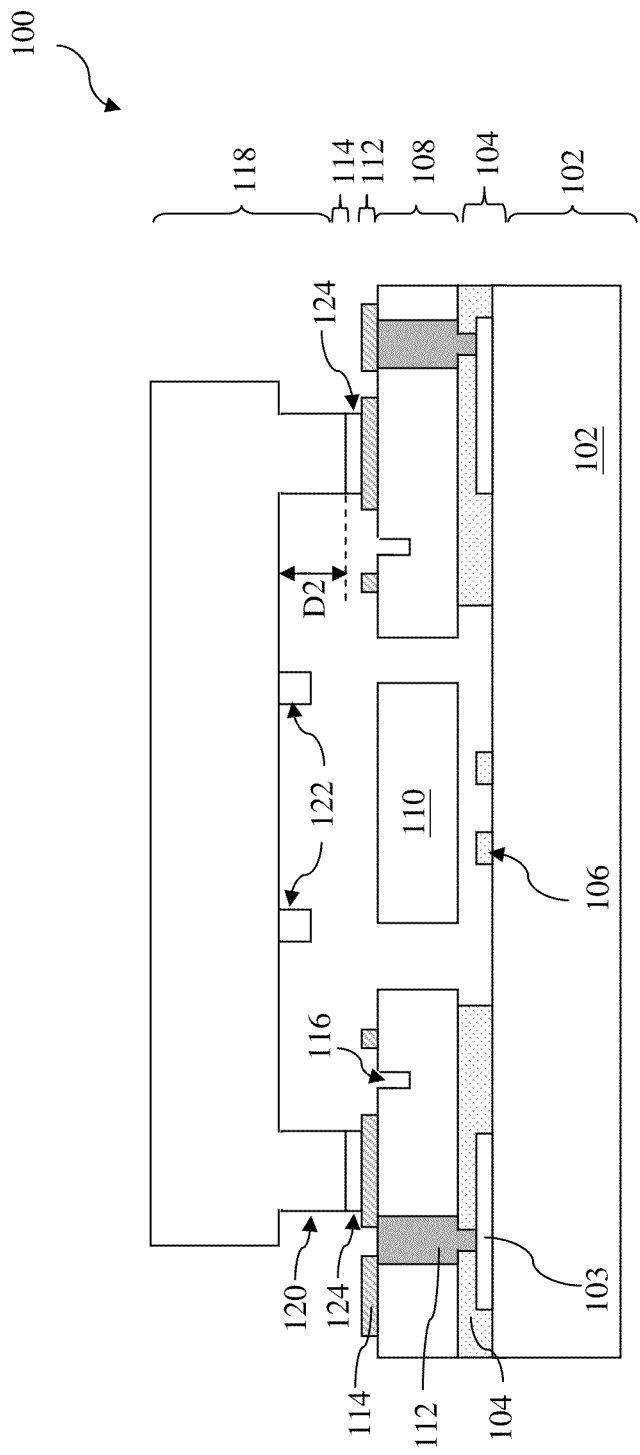
FIG. 2 illustrates another embodiment of a motion sensor structure in a sectional view constructed according to aspects of the present disclosure.

FIG. 2 is a sectional view of a motion sensor structure 100 constructed according to aspects of the present disclosure in another embodiment. Referring to FIG. 2, the motion sensor structure 100 includes a first substrate 102. The first substrate 102 includes various integrated circuit, such as driving circuit and/or sensing circuit to one or more motion sensors. In one example, the first substrate 102 is a silicon wafer or a portion of the silicon wafer having integrated circuit formed thereon. The integrated circuit includes complementary metal-oxide-semiconductor (CMOS) field effect transistors (FETs) or additionally other active and passive devices. Accordingly, the first substrate 102 is also referred to as CMOS substrate. Various metal features 103 are formed on the first substrate 102 by a suitable technique such as deposition and patterning. In one example, the metal features 103 includes aluminum copper (AlCu) alloy. In another example, the first substrate 102 further includes a silicon oxide layer 104 formed on a surface and patterned to form various openings and various stoppers 106.

The motion sensor structure 100 includes a second substrate 108 bonded to the first substrate 102. The second substrate 108 includes one or more motion sensors or other MEMS devices 110, therefore also referred to as MEMS substrate. In one example, the second substrate 108 is a silicon wafer having motion sensors formed thereon. In the present embodiment, the second substrate 108 is bonded to the first substrate 102 using fusion bonding. In furtherance of the embodiment, the fusion bonding is achieved between silicon and silicon oxide. The second substrate 108 further includes through silicon via (TSV) features 112 connected to the metal features 103 and forming conductive paths to electrically coupled the motion sensors 110 to the integrated circuit of the first substrate 102. In one example, the TSV features 112 include tungsten plugs. The second substrate 108 also includes a metal layer 114, such as AlCu, patterned to provide interconnection and bonding pads (for subsequent bonding). Particularly, various trenches (or holes) 116 are formed in the second substrate 108 for subsequent bonding and reducing the associated bonding issue.

Figure 3:
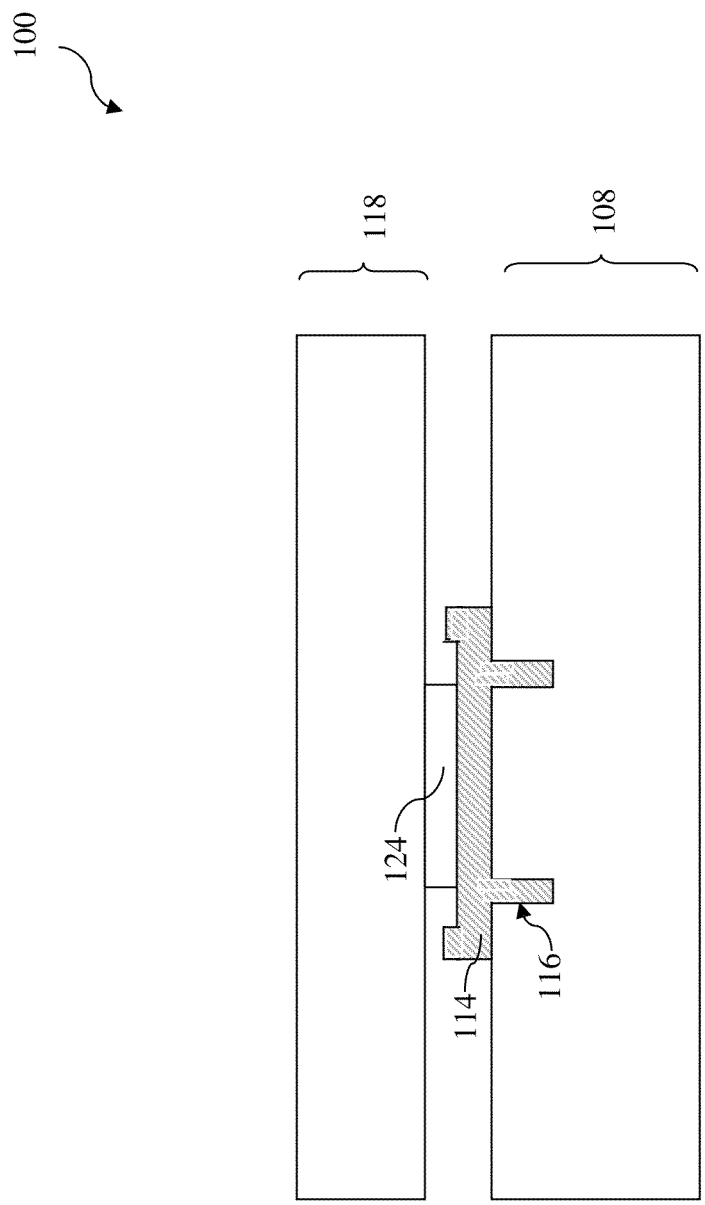
FIG. 3 illustrates an fragmentary sectional view of the motion sensor structure in FIG. 2 constructed according to aspects of the present disclosure in one embodiment.

The motion sensor structure 100 includes a third substrate (or capping substrate) 118 bonded to the second substrate 108 to provide an enclosed space for the motion sensors 110 and provide protection thereto. In one example, the third substrate 118 is a silicon wafer. The third substrate 118 is patterned to form recessed regions aligned with the motion sensor 110, and further form extruded features 120 for the subsequent bonding and stoppers 122 in the recessed region. In one example, a bonding material layer 124, such as germanium (Ge), is formed on the extruded features 120. The third substrate 118 is directly bonded to the second substrate 108 instead of the first substrate 102. The third substrate 118 is directly bonded to the second substrate 108 using eutectic bonding in the present embodiment. In this example, the eutectic bonding is achieved between the germanium layer 124 and the AlCu features 114. Particularly, during the eutectic bonding, the bonding material can be squished out, causing contamination or even failure of the motion sensor structure. The trenches 116 are configured to prevent the squish issue. The depth and width of the trenches 116 are designed to effectively prevent the squishing issue. It is further illustrated in FIG. 3 as a fragmentary sectional view of the motion sensor structure 100. The trenches 116 functions as a barrier for holding the squeezed-out eutectic compound during a subsequent bonding process. Thus, the squishing issue is eliminated or reduced.

Various advantages may present in various examples of the motion sensor structure 100. Fir example, the fusion bond ratio is increased since no oxide area at the bond ring is to be open. Therefore, the fusion bond area between the first and second substrates 102 and 108 is enlarged. Other advantages that may present in various examples are provided below. In one example, the line yield in fusion and eutectic bonding processes are improved. In another example, the eutectic bonding strength between the second substrate 108 and the third substrate 118 is enhanced. The IMD cracking issue is eliminated since the third substrate 118 is not directly bonded to the first substrate 102. In another example, the cap depth D2 of the capping substrate 118 is well controlled to a relatively low value as the through-via bonding is eliminated. The process and device quality of the motion sensor structure with advanced technology and reduced die size are more enhanced.

FIGS. 4(a) through 4(f) provide sectional views of the capping substrate 118 at various fabrication stages. FIGS. 5(a) through 5(g) provide sectional views of the motion sensor structure 100 at various fabrication stages, including making the CMOS substrate 102 and the MEMS substrate 108. With references to FIGS. 4 and 5, the motion sensor structure 100 and the method making the same are further described according one embodiment.

Referring to FIG. 4(a), a silicon substrate 118 is provided as the capping substrate. In one embodiment, a germanium (Ge) layer 124 is formed on the capping substrate 118 and is further patterned using a lithography process and an etching process. A patterned photoresist (PR) layer 132 is used as an etch mask to pattern the Ge layer 124. In the present embodiment, the patterned Ge layer 124 defines the bonding ring.

Referring to FIG. 4(b), a first trench etch process is applied to the silicon substrate using the patterned Ge layer 124 as an etch mask, forming a recessed region (or trench) 134 of the capping substrate 118. The patterned PR layer 132 is removed after the first etch process or alternatively after the patterning of the Ge layer 124. The first etch process defines stopper gap in the present embodiment.

Referring to FIG. 4(c), a silicon oxide layer 136 is formed on the capping substrate 118 and is further patterned using a lithography process and an etching process, forming a portion on the Ge layer 124 and a portion in the recessed region 134. In the present embodiment, the patterning of the silicon oxide layer 136 defines stopper locations.

Referring to FIG. 4(d), another patterned PR layer 138 is formed on the capping substrate 118 by a lithography process. In the present embodiment, the patterned PT layer 138 defines the geometry of the capping substrate 118.

Referring to FIG. 4(e), the capping substrate 118 is further etched in a second trench etch process using the patterned PR layer 138 as an etch mask.

Referring to FIG. 4(f), the patterned PR layer 138 is removed by wet stripping or plasma ashing. Then the capping substrate 118 is further etched in a third trench etch process using the patterned silicon oxide layer 136 as an etch mask, resulting in the extruded features (bonding pads) 120 for bonding, recessed region 134, and the stoppers 122 in the recessed region. Thereafter, the silicon oxide layer 136 is removed for bonding, by a suitable process, such as hydrofluorine (HF) etching.

Now referring to FIG. 5(a), another silicon substrate 102 is provided as the CMOS substrate. Various devices (such as CMOS transistors) and interconnect features (such as metal lines and vias/contacts) are formed thereon. In the present embodiment, various metal (e.g., AlCu) features 103 are formed on the CMOS substrate 102. A cavity dielectric layer 104 is deposited on the CMOS substrate 102 by a suitable process, such as chemical vapor deposition (CVD). In this example, the cavity dielectric layer 104 includes a silicon oxide layer. Therefore, the cavity dielectric layer 104 is also referred to as oxide layer 104. In another example, the cavity dielectric layer 104 may additionally or alternatively include other suitable dielectric layer. In yet another example, the metal features 103 are metal features in the top metal layer of the interconnect structure formed on the CMOS substrate 102.

Referring to FIG. 5(b), the silicon oxide layer 104 is further patterned to form stoppers 106 and openings, using a lithography process and an etching process. In one embodiment, the patterning of the silicon oxide layer 104 includes two steps. In the first step, a recess is formed in the silicon oxide layer within the region where stopper 106 to be formed. In the second step, various openings 142 are formed to expose the metal features 103 and various stoppers 106 are formed in the recessed region. Each step may include respective lithography process and etching process.

Referring to FIG. 5(c), a MEMS substrate 108 is bonded to the CMOS substrate 102 using fusion bonding. The MEMS substrate 108 is a silicon substrate in the present embodiment. The fusion bonding is achieved between the silicon oxide of the CMOS substrate 102 and the silicon of the MEMS substrate 108. A proper bonding process is applied to fusion bond the corresponding two substrates. For example, bonding surfaces may be cleaned, A pressure/force may be applied at an elevated temperature for fusion bonding. The MEMS substrate 108 may be thinned down to reduce the thickness.

Referring to FIG. 5(d), various through-silicon vias 144 are formed in the MEMS substrate 108 by an etching process. A patterned PR layer or a hard mask is used as an etch mask during the etching process to form the through-silicon vias 144.

Referring to FIG. 5(e), a metal 112 is filled in the vias 144 to provide electrical interconnection between the CMOS substrate 102 and the MEMS substrate 108. In the present embodiment, tungsten is deposited in the vias 144 to form tungsten plugs. In one example, the tungsten plugs may be formed by a procedure including CVD or additionally chemical mechanical polishing (CMP). Subsequently, various metal features are formed on the MEMS substrate 108 by deposition and patterning. In the present embodiment, a AlCu layer 114 is deposited on the MEMS substrate 108 by sputtering or other suitable technique and is further patterned by etching. A titanium nitride (TiN) layer 146 is deposited on the MEMS substrate 108 by sputtering or other suitable technique and is further patterned by etching. The TiN layer 146 is formed to provide a protection to the AlCu layer from corrosion. The TiN layer 146 may be replaced by other suitable material, such as tantalum nitride (TaN), for the protection.

Referring to FIG. 5(f), motion sensors 110 or other MEMS devices are formed on the MEMS substrate 108 by various processes including etching and lithography process. Additionally, squish-prevention trenches 116 are formed on the MEMS substrate by lithography process and etching. In the present embodiment, the AlCu layer 114 is patterned with additional features adjacent the trenches 116 to provide a further mechanism to prevent from the squish.

Referring to FIG. 5(g), the capping substrate 118 (fabricated at FIG. 4) is bonded to the MEMS substrate 108 using eutectic bonding. In the present embodiment, the eutectic bonding is achieved between the germanium layer 124 and the AlCu layer 114. Particularly, during the eutectic bonding, the bonding material can be squished out, causing contamination or even device failure. The squish prevention trenches 116 are configured to prevent the squish issue. The depth and width of the trenches 116 are designed to effectively prevent the squishing issue. The trenches 116 function as a barrier for holding the squeezed-out eutectic compound during the eutectic bonding process. Thus, the squishing issue is eliminated or reduced. The capping substrate 118 may be subsequently opened by etching, dicing, or combination.

Figure 4:
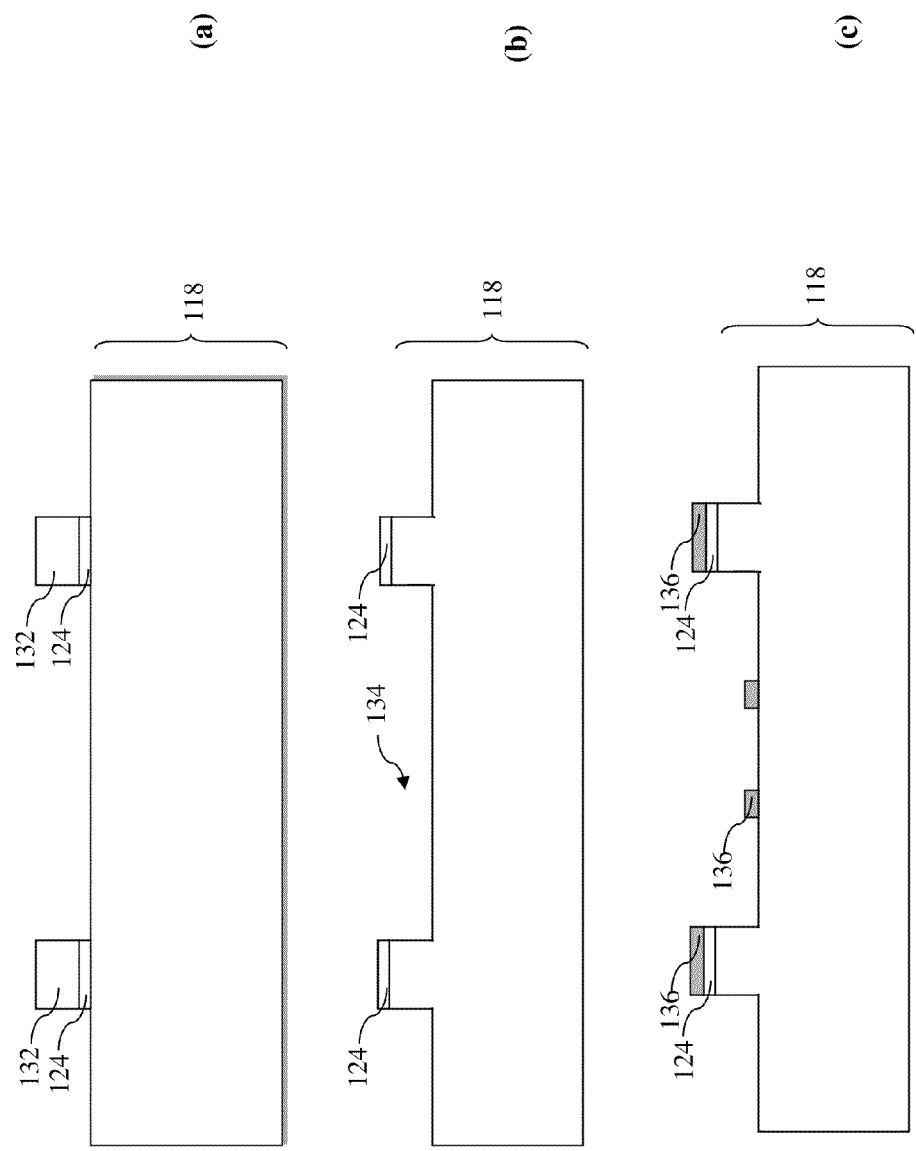
FIGS. 4(a) through 4(f) illustrates sectional views of a motion sensor structure at various fabrication stages constructed according to aspects of the present disclosure in one or more embodiments.
Figure 4:
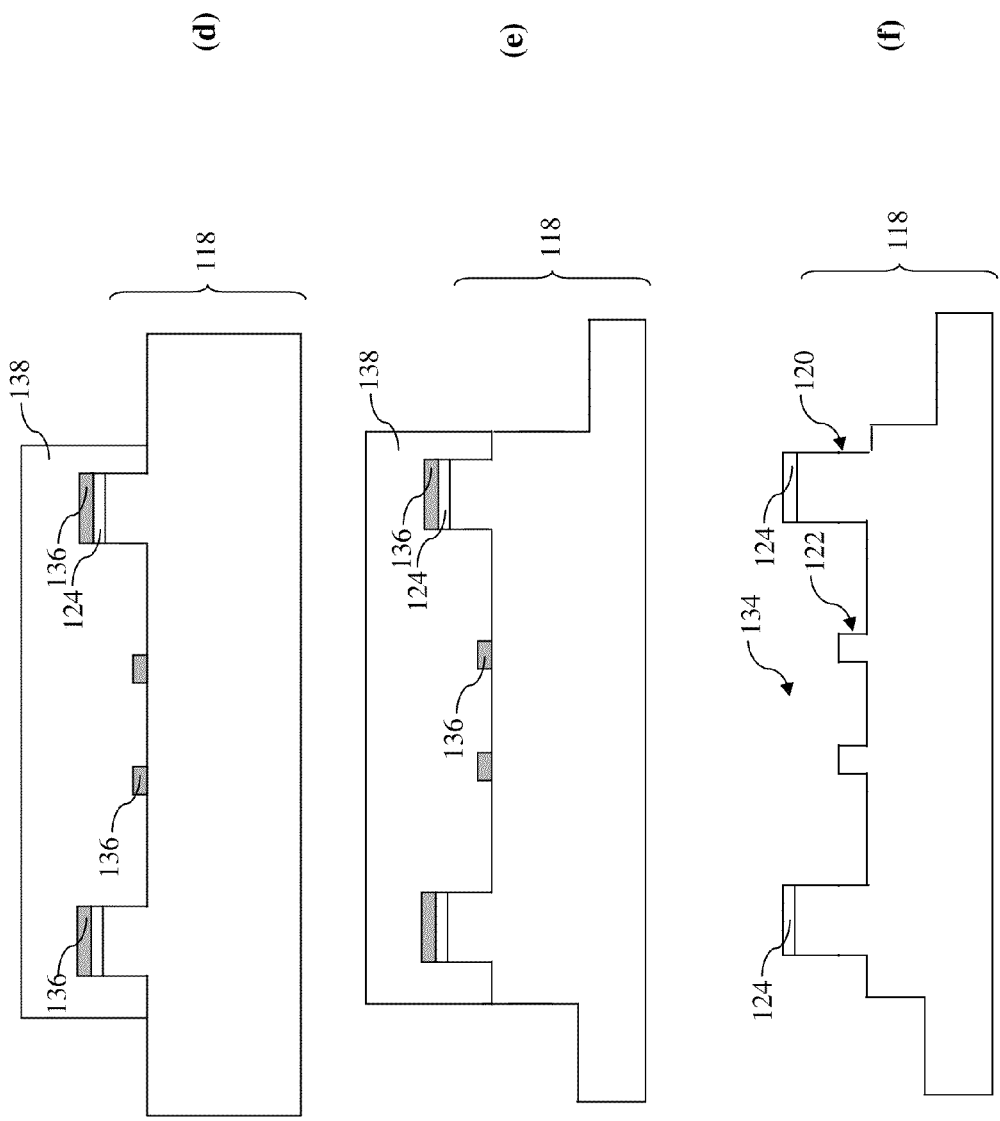
Figure 5:
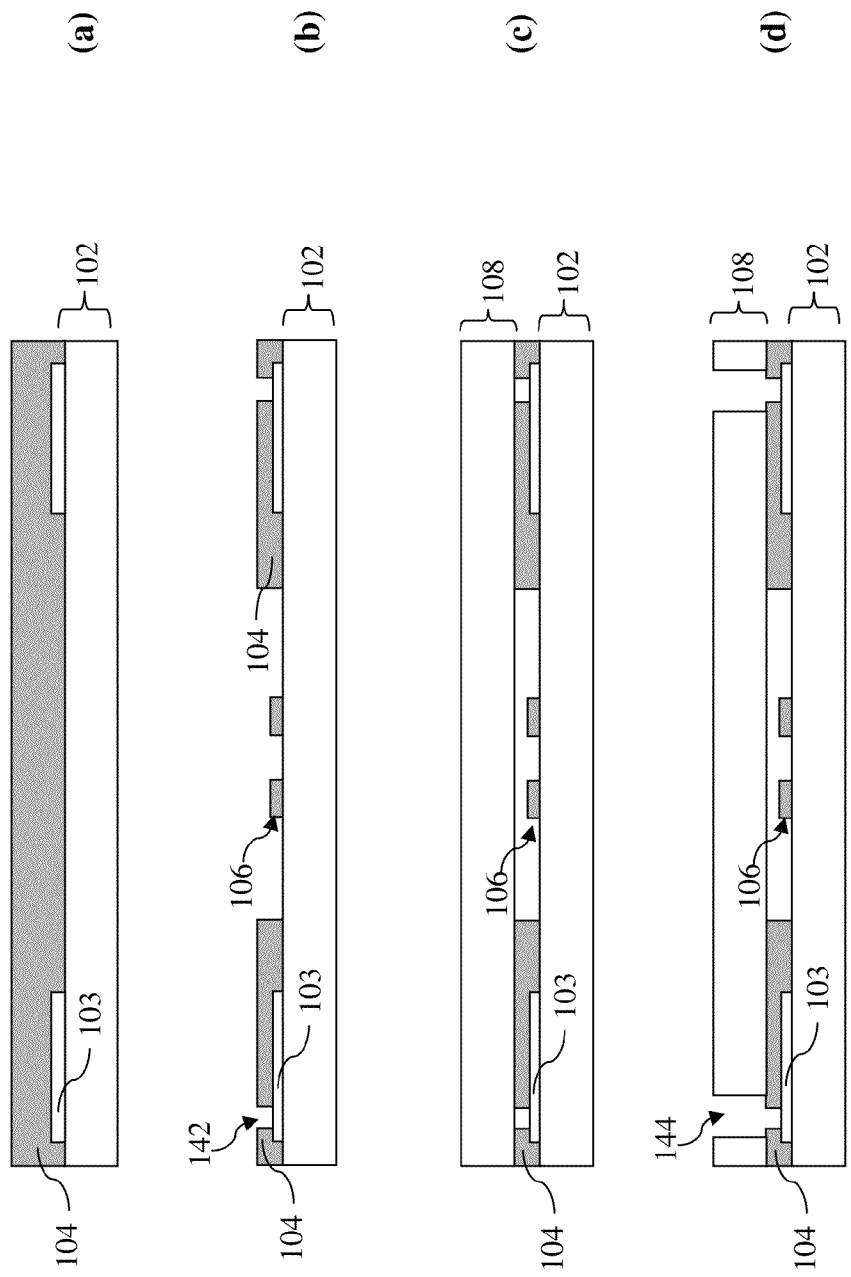
FIGS. 5(a) through 5(g) illustrates sectional views of a motion sensor structure at various fabrication stages constructed according to aspects of the present disclosure in one or more other embodiments.
Figure 5:
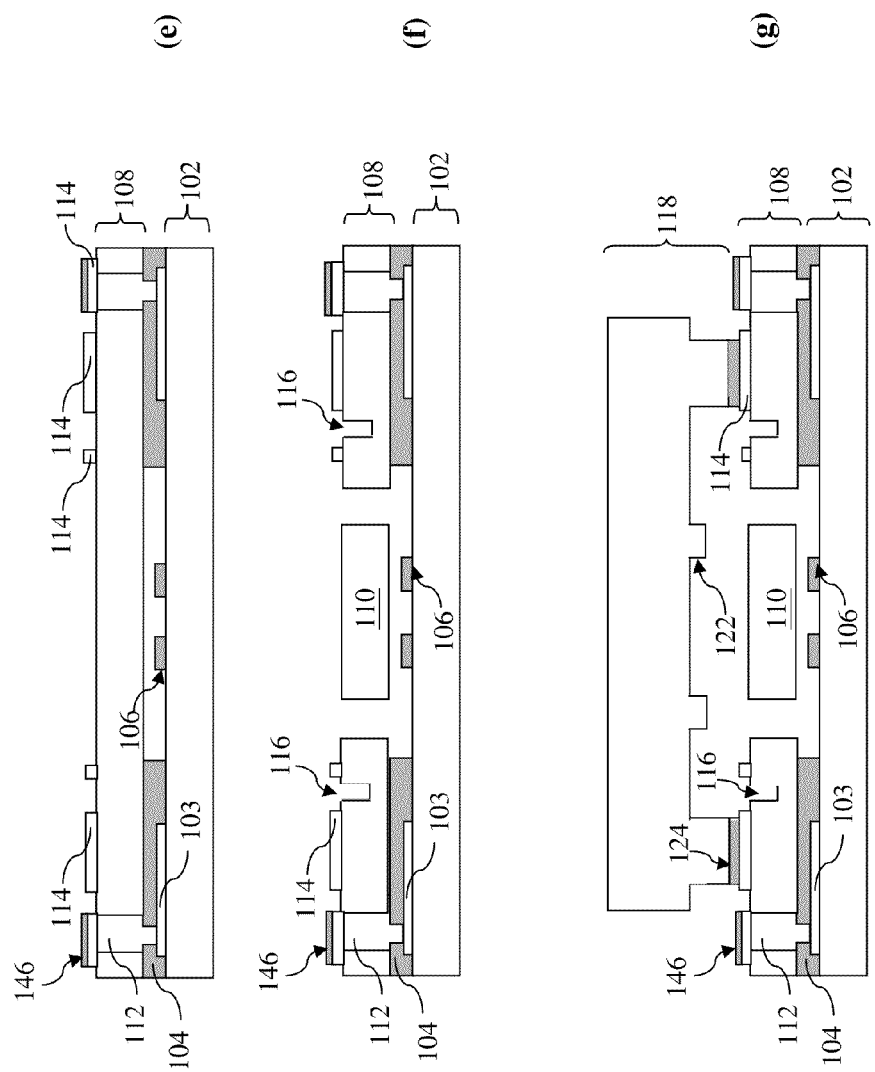

The method may further include other processing steps before, during, and after the described processing steps in FIGS. 4 and 5. In one example, a probe test may be implemented at the wafer lever through the exposed metal pads for qualification, sorting, or other purposes. In another example, a dicing process is applied to the bonded substrates to separate device chips (or dies). In yet another example, the method further includes a step to attach the diced chips to packing substrates, respectively, using a technology known in the art or to be developed. In yet another example, the method further includes a step to perform a wiring process to couple the circuit of the CMOS substrate to respective packaging substrates. In one embodiment, the wiring process uses a gold line to attach to the wiring pad in one end and attach to the respective packaging substrate at another end. In an alternative embodiment, the wiring pads can be electrically coupled to the packaging substrate using other technology, such as bump.

Although the method and the motion sensor structure are described in detail, other alternatives and processing steps may be included. For example, the motion sensor may include one or more micro-minors for various applications including display, optical switch, and mask-less exposure. The various bonding pads can be designed in different configurations, geometry, and dimensions for various purposes. In one example, the various bonding materials may include other suitable material for the fusion bonding and/or eutectic bonding.

Thus, the present disclosure provides one embodiment of a motion sensor structure. The motion sensor structure includes a first substrate having an integrated circuit formed thereon; a second substrate bonded to the first substrate from a first surface, wherein the second substrate includes a motion sensor formed thereon; and a third substrate bonded to a second surface of the second substrate, wherein the third substrate includes a recessed region aligned with the motion sensor.

In one embodiment of the motion sensor structure, the second substrate is bonded to the first substrate by fusion bonding.

In another embodiment, the first substrate further includes a silicon oxide layer; the second substrate includes silicon; and the second substrate is bonded to the first substrate between silicon and silicon oxide by fusion bonding.

In another embodiment, the third substrate is bonded to the second substrate by eutectic bonding. In yet another embodiment, the third substrate includes a germanium layer; the second substrate includes an aluminum copper layer on the second surface; and the third substrate is bonded to the second substrate between the germanium layer and the aluminum copper layer by eutectic bonding.

In yet another embodiment, the second substrate further includes squish prevention trenches formed thereon and configured to prevent squish issue during an eutectic bonding between the second and third substrates.

In yet another embodiment, the first substrate includes complimentary metal-oxide-semiconductor (CMOS) transistors formed thereon. In yet another embodiment, the first substrate includes at least one stopper configured to constrain the motion sensor.

In yet another embodiment, the third substrate includes at least one stopper configured to constrain the motion sensor. In yet another embodiment, the second substrate further includes vias configured to electrically couple the motion sensor to the integrated circuit of the first substrate.

The present disclosure also provides another embodiment of an micro-electro mechanical system (MEMS) structure. The MEMS structure includes a first silicon substrate having an integrated circuit formed thereon; a second silicon substrate having a motion sensor formed thereon and a squish-prevention trench formed thereon; and a third silicon substrate having a recessed region aligned with the motion sensor. The second substrates is configured between the first and second substrate. The second substrate is fusion bonded to the first substrate and eutectic bonded to the third substrate.

In one embodiment of the MEMS structure, the first silicon substrate further includes a silicon oxide layer; and the second substrate is bonded to the first substrate between silicon and silicon oxide by fusion bonding.

In another embodiment, the third silicon substrate includes a germanium layer; the second silicon substrate includes an aluminum copper layer; and the third silicon substrate is bonded to the second silicon substrate between the germanium layer and the aluminum copper layer by eutectic bonding.

In yet another embodiment, the integrated circuit of the first silicon substrate includes complimentary metal-oxide-semiconductor (CMOS) transistors.

In yet another embodiment, the first silicon substrate includes a first stopper configured to constrain the motion sensor; and the third silicon substrate includes a second stopper configured to constrain the motion sensor.

In yet another embodiment, the second silicon substrate further includes through silicon vias configured to electrically couple the motion sensor to the integrated circuit of the first silicon substrate The present disclosure also provides one embodiment of a method for manufacturing a micro-electro mechanical system (MEMS) device. The method includes forming bonding pads on a first substrate; forming a motion sensor on a second substrate; bonding the second substrate to the first substrate through the bonding pad by fusion bonding; and bonding a capping substrate to the second substrate by eutectic bonding.

In one embodiment, the method further includes forming a germanium layer on the capping substrate; and forming an aluminum copper alloy layer on the second substrate; wherein the bonding of the capping substrate to the second substrate includes forming eutectic bonding between the germanium layer and the aluminum copper alloy layer.

In another embodiment, the method further includes forming a silicon oxide layer on the first substrate, wherein the second substrate includes a silicon surface; and the bonding of the second substrate to the first substrate includes forming fusion bonding between the silicon oxide layer and the silicon surface of the second substrate.

In yet another embodiment, the method further includes forming tungsten plugs through the second substrate, wherein the tungsten plugs are configured to electrically couple the second substrate to the first substrate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A sensor structure, comprising:
   a first substrate having an integrated circuit formed thereon;
   a second substrate bonded to the first substrate from a first surface, wherein the second substrate comprises a sensor formed thereon; and
   a third substrate bonded to a second surface of the second substrate using a bonding layer, wherein the third substrate includes a recessed region aligned with the sensor, wherein:
      the first substrate includes a silicon oxide layer;
      the second substrate includes silicon adjacent to the first surface and the second substrate is bonded to the first substrate between the silicon and silicon oxide layer by fusion bonding;
      the second substrate includes a trench adjacent to the second surface that is filled, at least in part, with material from the bonding layer.

2. The sensor structure of claim 1, wherein the third substrate is bonded to the second substrate by a eutectic bond.

3. The sensor structure of claim 1, wherein the the material of the bonding layer includes aluminum and copper.

4. The sensor structure of claim 1, wherein the first substrate includes at least one stopper configured to constrain the sensor.

5. The sensor structure of claim 1, wherein the third substrate includes at least one stopper configured to constrain the sensor.

6. The sensor structure of claim 1, wherein the second substrate further includes vias configured to electrically couple the sensor to the integrated circuit of the first substrate.

7. A sensor structure, comprising:
   a first substrate having an integrated circuit formed thereon;
   a second substrate bonded to the first substrate from a first surface, wherein the second substrate comprises a sensor formed thereon; and
   a third substrate bonded to a second surface of the second substrate, wherein the third substrate includes a recessed region aligned with the sensor,
   wherein:
      the first substrate includes a silicon oxide layer;
      the second substrate includes silicon;
      the second substrate is bonded to the first substrate between the silicon and silicon oxide layer by a fusion bond;
      the third substrate includes a germanium layer;
      the second substrate includes an aluminum copper layer on the second surface; and
      the third substrate is bonded to the second substrate between the germanium layer and the aluminum copper layer by eutectic bonding.

8. An micro-electro mechanical system (MEMS) structure, comprising:
   a first silicon substrate having an integrated circuit formed thereon;
   a second silicon substrate having a sensor formed thereon and a squish-prevention trench formed thereon; and
   a third silicon substrate having a recessed region aligned with the sensor, wherein
   the second substrate is configured between the first and third substrate;
   the second substrate is fusion bonded to the first substrate and eutectic bonded to the third substrate,
   wherein:
      the first silicon substrate includes a silicon oxide layer; and
      the second substrate is bonded to the first substrate between silicon and silicon oxide by fusion bonding; and
      the second substrate is bonded to the third substrate with a bonding material, the bonding material existing, at least in part, in the squish-prevention trench.

9. The MEMS structure of claim 8, wherein the integrated circuit of the first silicon substrate includes complimentary metal-oxide-semiconductor (CMOS) transistors.

10. The MEMS structure of claim 8, wherein:
    the first silicon substrate includes a first stopper configured to constrain the sensor; and
    the third silicon substrate includes a second stopper configured to constrain the sensor.

11. The MEMS structure of claim 8, wherein the second silicon substrate further includes through silicon vias configured to electrically couple the sensor to the integrated circuit of the first silicon substrate.

12. An micro-electro mechanical system (MEMS) structure, comprising:
    a first silicon substrate having an integrated circuit formed thereon;
    a second silicon substrate having a sensor formed thereon and a squish-prevention trench formed thereon; and
    a third silicon substrate having a recessed region aligned with the sensor, wherein
    the second substrate is configured between the first and third substrate;
    the second substrate is fusion bonded to the first substrate and eutectic bonded to the third substrate,
    wherein:
       the first silicon substrate includes a silicon oxide layer; and the second substrate is bonded to the first substrate between silicon and silicon oxide by fusion bonding;
the third silicon substrate includes a germanium layer;
the second silicon substrate includes an aluminum copper layer; and
the third silicon substrate is bonded to the second silicon substrate between the germanium layer and the aluminum copper layer by eutectic bonding.

13. A method for manufacturing a micro-electro mechanical system (MEMS) device, comprising:
forming bonding pads on a first substrate;
forming a sensor on a second substrate;
bonding the second substrate to the first substrate through the bonding pads by fusion bonding;
bonding a capping substrate to the second substrate by eutectic bonding
forming a germanium layer on the capping substrate; and
forming an aluminum copper alloy layer on the second substrate, wherein the bonding of the capping substrate to the second substrate includes forming eutectic bonding between the germanium layer and the aluminum copper alloy layer.

14. The method of claim 13, further comprising forming a silicon oxide layer on the first substrate, wherein
the second substrate includes a silicon surface; and
the bonding of the second substrate to the first substrate includes forming fusion bonding between the silicon oxide layer and the silicon surface of the second substrate.

15. The method of claim 13, further comprising forming tungsten plugs through the second substrate, wherein the tungsten plugs are configured to electrically couple the second substrate to the first substrate.

16. A sensor structure, comprising:
a first substrate having an integrated circuit formed thereon;
a second substrate bonded to the first substrate from a first surface, wherein the second substrate comprises a sensor formed thereon; and
a third substrate bonded to a second surface of the second substrate, wherein the third substrate includes a recessed region aligned with the sensor,
wherein:
the third substrate includes a germanium layer;
the second substrate includes an aluminum copper layer on the second surface; and
the third substrate is bonded to the second substrate between the germanium layer and the aluminum copper layer by eutectic bonding.

17. The sensor structure of claim 16, wherein the second substrate is bonded to the first substrate by fusion bonding.

18. The sensor structure of claim 17, wherein:
the first substrate includes a silicon oxide layer;
the second substrate includes silicon; and
the second substrate is bonded to the first substrate between the silicon and silicon oxide by fusion bonding.

19. The sensor structure of claim 16, wherein the second substrate further includes squish prevention trenches formed thereon and configured to prevent squish issue during an eutectic bonding between the second and third substrates.

20. The sensor structure of claim 16, wherein the first substrate includes complimentary metal-oxide-semiconductor (CMOS) transistors formed thereon.

21. The sensor structure of claim 16, wherein the first substrate includes at least one stopper configured to constrain the sensor.

22. The sensor structure of claim 16, wherein the third substrate includes at least one stopper configured to constrain the sensor.

23. The sensor structure of claim 16, wherein the second substrate further includes vias configured to electrically couple the sensor to the integrated circuit of the first substrate.

24. An micro-electro mechanical system (MEMS) structure, comprising:
a first silicon substrate having an integrated circuit formed thereon;
a second silicon substrate having a sensor formed thereon and a squish-prevention trench formed thereon; and
a third silicon substrate having a recessed region aligned with the sensor, wherein
the second substrate is configured between the first and third substrate;
the second substrate is fusion bonded to the first substrate and eutectic bonded to the third substrate,
wherein:
the third silicon substrate includes a germanium layer;
the second silicon substrate includes an aluminum copper layer; and
the third silicon substrate is bonded to the second silicon substrate between the germanium layer and the aluminum copper layer by eutectic bonding.

25. The MEMS structure of claim 24, wherein:
the first silicon substrate includes a silicon oxide layer; and
the second substrate is bonded to the first substrate between the silicon and silicon oxide by fusion bonding.

26. The MEMS structure of claim 24, wherein the integrated circuit of the first silicon substrate includes complimentary metal-oxide-semiconductor (CMOS) transistors.

27. The MEMS structure of claim 24, wherein:
the first silicon substrate includes a first stopper configured to constrain the sensor; and
the third silicon substrate includes a second stopper configured to constrain the sensor.

28. The MEMS structure of claim 24, wherein the second silicon substrate further includes through silicon vias configured to electrically couple the sensor to the integrated circuit of the first silicon substrate.

29. A method for manufacturing a micro-electro mechanical system (MEMS) device, comprising:
forming bonding pads on a first substrate;
forming a sensor on a second substrate;
bonding the second substrate to the first substrate through the bonding pads by fusion bonding;
bonding a capping substrate to the second substrate by eutectic bonding; and
forming a silicon oxide layer on the first substrate,
wherein:
the second substrate includes a silicon surface and the bonding of the second substrate to the first substrate includes forming fusion bonding between the silicon oxide layer and the silicon surface of the second substrate; and
the second substrate includes a trench and a bonding layer, and the bonding of the second substrate to the third substrate by eutectic bonding includes moving a portion of the bonding layer into the trench.

30. A method for manufacturing a micro-electro mechanical system (MEMS) device, comprising:
forming bonding pads on a first substrate;
forming a sensor on a second substrate;
bonding the second substrate to the first substrate through the bonding pads by fusion bonding;

bonding a capping substrate to the second substrate by eutectic bonding; and forming a silicon oxide layer on the first substrate, forming a germanium layer on the capping substrate; and forming an aluminum copper alloy layer on the second substrate, wherein the bonding of the capping substrate to the second substrate includes forming eutectic bonding between the germanium layer and the aluminum copper alloy layer.

31. The method of claim 29, further comprising forming tungsten plugs through the second substrate, wherein the tungsten plugs are configured to electrically couple the second substrate to the first substrate.

* * * * *